Figure 1:
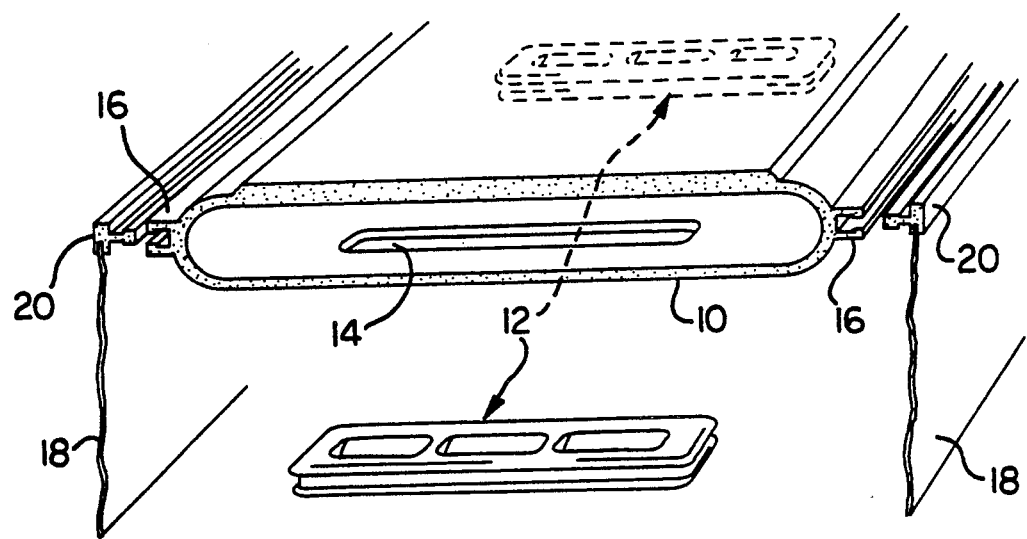

United States Patent [19]

Lazzari

[11] Patent Number: 4,993,885
[45] Date of Patent: Feb. 19, 1991

[54] ADAPTABLE PASSAGE FOR THE TRANSPORATION OF PARTS IN AN ULTRA-CLEAN ENVIRONMENT

[75] Inventor: Jean-Pierre Lazzari, Corenc, France

[73] Assignee: Commissariat A L'Energie Atomique, Paris, France

[21] Appl. No.: 361,134

[22] Filed: Jun. 5, 1989

[30] Foreign Application Priority Data

Jun. 9, 1988 [FR] France ............................. 88 07682

[51] Int. Cl.⁵ ............................................. B65G 53/58
[52] U.S. Cl. .......................................... 406/89; 406/95
[58] Field of Search ....................... 406/86, 87, 88, 89, 406/90, 91, 92, 93, 94, 95, 191, 196

[56] References Cited

U.S. PATENT DOCUMENTS

| | | | |
|---|---|---|---|
| 1,759,983 | 5/1930 | Houston | 406/91 |
| 3,851,660 | 12/1974 | Lieberman et al. | 406/88 |
| 4,171,925 | 10/1979 | Krambrock | 406/95 |
| 4,540,326 | 9/1985 | Southworth . | |
| 4,595,317 | 6/1986 | Moller et al. | 406/95 |
| 4,615,648 | 10/1986 | Merz | 406/95 |

Primary Examiner—Sherman Basinger
Assistant Examiner—Stephen P. Avila
Attorney, Agent, or Firm—Pearne, Gordon, McCoy & Granger

[57] ABSTRACT

Passage having a first type of unitary elements constituted by unitary pipes (10) provided with nozzles (12) and a fastening system (16) on each of its sides, as well as a second type of unitary elements constituted by a skirt (18) made from a flexible material and which is impermeable to air. These unitary elements are assembled with one another, so as to adapt at random the geometry of the passage.

9 Claims, 2 Drawing Sheets

ADAPTABLE PASSAGE FOR THE TRANSPORATION OF PARTS IN AN ULTRA-CLEAN ENVIRONMENT

DESCRIPTION

The present invention relates to a passage or corridor of an adaptable nature for transporting parts in an ultra-clean environment. It more particularly provides a protection against pollution for silicon wafers during their transportation.

During the manufacture of integrated circuits, silicon wafers are stored in loading and unloading stations and are then moved by suitable conveying means (air cushions, belts, etc.) to the treatment stations (reactor, irradiator, furnace, etc.) and then they are again stored after treatment.

The different treatment stations have an ultra-clean, non-polluting environment for the wafers, but a contamination by dust is always possible during transportation, if the transportation or conveying system does not benefit from the environmental precautions.

In order to solve the problem of pollution during the passage of the wafers to the stations, the conveying means are normally placed in an adapted rigid tube, which is under the influence of a non-polluting air flow. However, this solution suffers from the major disadvantage of requiring a mechanism adapted once and for all to the equipment and which is difficult to apply to all the transportation cases encountered during the passage of the wafers.

This problem is obviated by the invention, which relates to a passage designed so as to be easily adaptable to all installations and to make it possible to maintain an ultra-clean environment no matter what the path followed by the passage.

More specifically, the present invention relates to an adaptable passage for the conveying of parts in an ultra-clean environment, which is defined by partitions formed in impermeable skirts and by at least one longitudinal pipe having nozzles issuing towards the inside of the passage, the pipe and the skirts being formed from unitary pipes and unitary skirts which can be fixed to one another by complimentary tight fastening systems.

The invention is in "ready-made" form and unitary pipes and unitary skirts can be added at random in order to obtain the desired length and geometry for the passage.

According to a preferred embodiment, a unitary pipe has on a face oriented towards the inside of the passage, a longitudinal row of openings into which are tightly fitted the nozzles.

A unitary pipe is made from a deformable material and has two parallel faces connected by two lateral edges carrying the fastening systems, each unitary pipe being terminated at its opposite longitudinal ends by complimentary nestable parts.

Each unitary skirt is made from a flexible material and has on at least one of its lateral edges a fastening system complimentary to the fastening systems carried by the lateral edges of the unitary pipes.

All the unitary elements (pipes and skirts) are made from a flexible, deformable material, so that the passage can curve in a random manner.

The fact that the unitary pipes are fitted into or nested in one another and that the skirts can be fastened to the pipes in any random configuration makes possible several realization types for the passage. For example, two pipes, each formed by a plurality of unitary pipes are connected by a skirt serving as the top. The alignments of the nozzles of each of the pipes face one another. Two other skirts fastened to the free fastening systems of each of the two pipes form flexible partitions.

When the passage comprises at least two juxtaposed pipes, said pipes are connected by linking parts connectable to the fastening systems carried by the lateral edges of the unitary pipes.

In a constructional variant of the passage, three pipes are attached to one another. The central pipe, located between the two lateral pipes, serves as the top. The lateral pipes hang on either side of the central pipe. The nozzles of each pipe are oriented towards the inside thereof. Skirts are fastened to the two lateral pipes and form flexible partitions.

In a variant of the invention, the nozzles issue obliquely towards the outside of the pipe.

In another variant, the nozzles issue perpendicular to the surface of the pipe.

According to a secondary feature, the passage has means for supporting the unitary pipes. These structures can be in the form of e.g. trestles.

The pipes are connected to a pressurizing device making it possible to produce an ultra-clean environment within the passage.

No matter which embodiment of the invention is involved, the partitions of the passage incorporate hanging skirts. The skirts of the same partition fixed to a pipe partly overlap. In addition, they do not touch the ground, a space being left between the lower ends of the skirts and the ground, so that the air overpressure can escape outside the passage.

The complete passage can consequently deform at random and can be enlarged by fitting in new unitary pipes on which hang the skirts. The passage adapts to the winding configuration of the conveying means and can be adapted to any environment. The choice of its geometry, the fact that it has one or more pipes and the arrangements of the skirts are not fixed, because it is possible to assemble the unitary elements.

The invention is described in greater detail hereinafter relative to non-limitative embodiments and the attached drawings, wherein show:

FIG. 1 diagrammatically and in perspective the unitary elements forming a passage according to the invention.

Figure 2A:
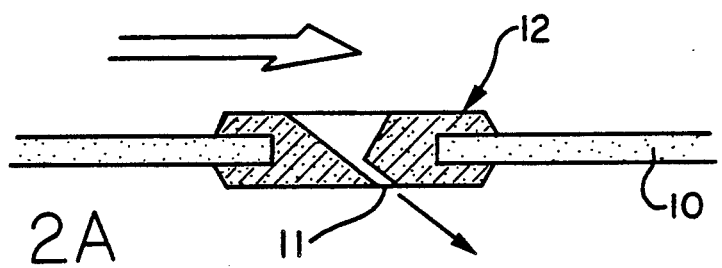

FIGS. 2A sectional views diagrammatically showing two types and 2B of nozzle usable in the passage according to FIG. 1.

Figure 3:
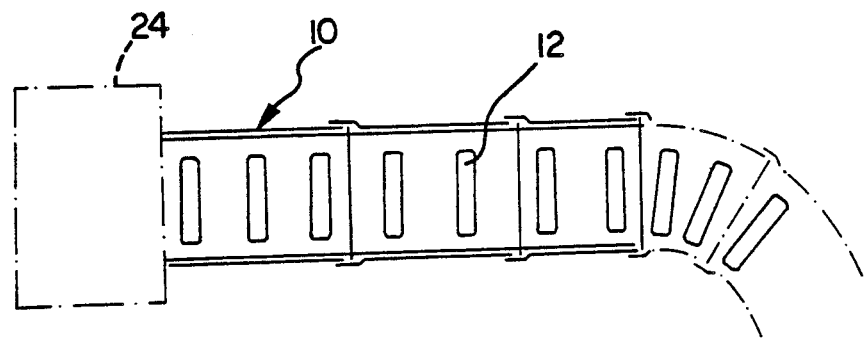

FIG. 3 diagrammatically and in plan view part of a passage for an ultra-clean environment produced with the aid of the unitary elements of FIG. 1.

Figure 4:
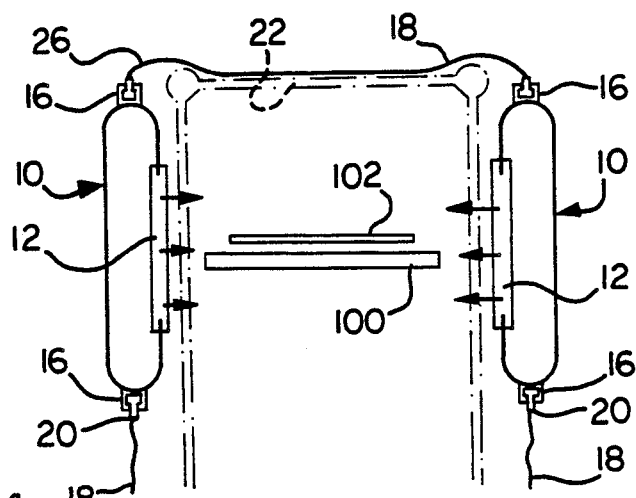

FIG. 4 diagrammatically and in cross-section, a constructional variant of a passage according to the invention.

Figure 5:
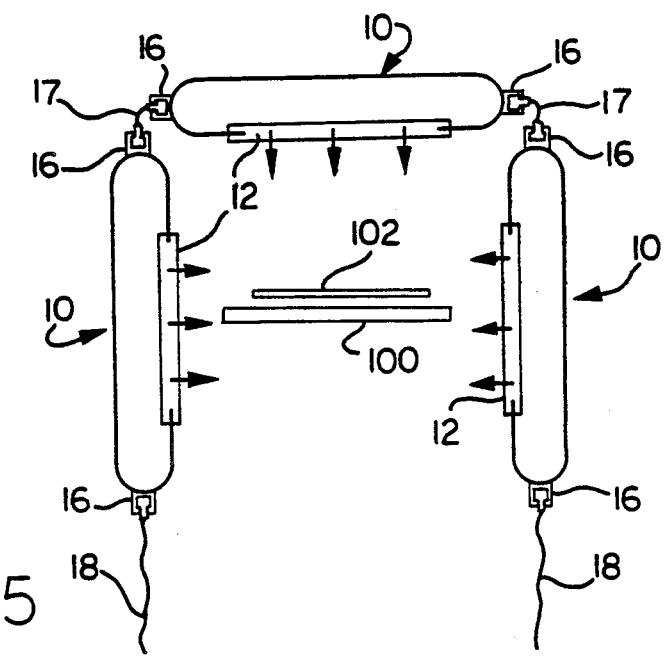

FIG. 5 diagrammatically and cross-section, another variant of a passage according to the invention.

FIG. 1 diagrammatically shows the unitary elements forming a passage according to the invention. It is possible to see a unitary pipe 10 made from a flexible and deformable material, e.g. a plastics material. The unitary pipe 10 has two planar, facing parallel walls, which are interconnected by two lateral edges, which have a semicircular cross-section in the represented embodiment. On one of the walls, which is to be turned towards the inside of the passage, are formed openings 14, which are e.g. rectangular and are oriented transversely and regularly distributed in a longitudinal row. A nozzle 12 is fitted into each opening 14.

On each lateral side, a fastening system 16 passes along the unitary pipe 10. Fastening system 16 is constituted by a bead or rim in which is formed a longitudinal channel opening towards the outside to give the bead a C-shaped cross-section.

A second unitary element consists of a unitary skirt 18 made from a flexible, deformable material, such as a plastics sheet (e.g. of polyvinyl or polyethylene). Skirt 18 is provided at at least one of its ends with a fastening system 20 which can be tightly fixed, preferably by nesting, to the fastening system 16 of the unitary pipe 10. Fastening system 20 is constituted by a single longitudinal bead or flange, which can be inserted into the channel of the fastening system 16.

In its simplest form, a passage according to the invention consists of the nesting of a plurality of unitary pipes 10 so as to form a long pipe. In order to permit this nesting, each of the unitary pipes has opposite longitudinal ends with complimentary shapes and as illustrated in FIG. 3. On each of its sides, fixed by means of the fastening systems 16,20, hang skirts formed by the association of a plurality of unitary skirts 18.

FIG. 2 diagrammatically shows two types of nozzle which can be used on a pipe.

FIG. 2A shows one example of a nozzle 12 fixed in one of the openings 14 of a unitary pipe 10. The nozzle 12 is fixed in opening 14 by nesting, the part of the wall of the unitary pipe 10 surrounding the opening 14 being received in a peripheral channel formed on nozzle 12. This nozzle is traversed by a corridor 11 oriented obliquely in a longitudinal direction. A circulation of air (indicated by the thick line arrows) within the pipe 10 is consequently discharged in the form of oblique jets (indicated by the thin line arrows) within the passage by corridor 11.

Figure 2B:
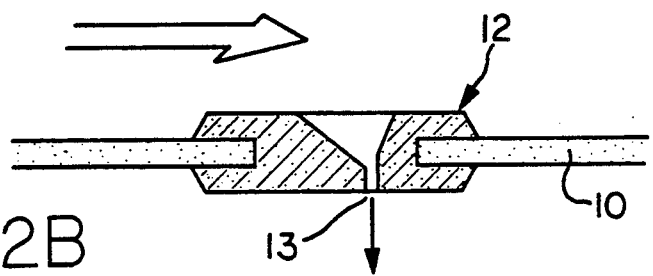

FIG. 2B diagrammatically shows a variant of nozzle 12 used in a passage according to the invention. In this case, nozzle 12 is traversed by a corridor 13, which issues in a direction perpendicular to the surface of the unitary pipe 10. The air jets discharged within the passage are consequently perpendicular to the surface of pipe 10 (thin line arrows).

FIGS. 1 and 3 diagrammatically show a passage for defining an ultra-clean environment. The passage is formed by unitary pipes 10 nested in order to form the upper partition of the passage and whose lateral edges support unitary skirts 18 forming the lateral partitions of the passage. An air flow is created within the pipes 10 by a pressurizing device 24. The air jets supplied by nozzles 12 within the passage maintain an ultra-clean environment.

FIG. 4 diagrammatically shows in cross-section a variant of a passage according to the invention. Two pipes formed from nested unitary pipes 10 are connected by a skirt formed by joining unitary skirts 18. The first skirt constitutes the upper wall of the passage. The two pipes hang on either side of said first skirt and their lower lateral edges support lateral skirts also formed by the joining of unitary skirts 18, so as to form the lateral walls of the passage. The assembly is supported by a support structure 22, e.g. a plastics materal or metallic trestle. Within the passage, it is possible to see an air cushion conveying track 100 and a silicon wafer 102 moving over the same. The nozzles 12 aligned on the pipes face one another and make it possible to supply air jets to the interior of the passage.

FIG. 5 diagrammatically shows in cross-section a variant of a passage according to the invention. The passage comprises three pipes, each formed by nesting unitary pipes 10. The three pipes are interconnected by longitudinal linking parts 17, which have an angle bracket-shaped section and which are fitted into the fastening system 16 of the unitary pipes. The central pipe forms the upper partition of the passage. The lateral pipes hang on either side of the central pipe. The nozzles 12 of all the pipes are turned towards the inside of the passage. The lateral partitions of the passage are completed by skirts formed from unitary skirts 18 and which hang beneath each of the lateral pipes. An air cushion conveying track 100 is able to circulate within the passage. A silicon wafer 102 travelling on track 100 is shown.

The arrows indicate air jets discharged by the nozzles and making it possible to maintain an ultra-clean environment within the passage.

As a result of its unitary elements made from deformable materials which can be added at random, a passage according to the invention can adapt by its dimensions and geometry to long and winding paths. It is easy to use, assembly and disassembly being very simple operations. Linked with a pressurizing device, it makes it possible to create an ultra-clean environment along its path.

We claim:

1. An adaptable passage having a top wall, side walls and an open bottom, said passage comprising:
    at least one longitudinal unitary pipe (10) provided with nozzles (12) issuing into the interior of the passage, said pipe constituting a substantial portion of at least one of said walls; and
    at least one impermeable unitary skirt (18), said skirt constituting a substantial portion of at least one of said walls, said pipe and skirt being attachable to one another by complimentary tight fastening systems (16, 20), whereby an ultra-clean environment may be maintained in said passage by blowing ultra-clean air through said pipe.

2. A passage according to claim 1, characterized in that each said unitary pipe (10) has on a face oriented towards the inside of the passage, a longitudinal row of openings (14) into which are tightly fitted the nozzles (12).

3. A passage according to claim 1, characterized in that the unitary pipe (10) is made from a deformable material and has two parallel faces connected by two lateral edges carrying the fastening systems (16), each unitary pipe (10) being terminated at its opposite longitudinal ends by complimentary nestable parts.

4. A passage according to claim 1, characterized in that each said unitary skirt (18) is made from a flexible material and has on at least one of its lateral edges a fastening system (20) complimentary with regards to the fastening systems (16) carried by the lateral edges of the unitary pipes (10).

5. A passage according to claim 3, characterized in that when the passage comprises at least two juxtaposed pipes, the latter are connected by linking parts (17) connectable to the fastening systems (16) carried by the lateral edges of the unitary pipes (10).

6. A passage according to claim 1, characterized in that the nozzles (12) issue obliquely to the outside of the pipe.

7. A passage according to claim 1, characterized in that the nozzles (12) issue perpendicular to the surface of the pipe.

8. A passage according to claim 1, characterized in that it has means (22) for supporting the unitary pipes (10).

9. A passage according to claim 1, characterized in that at least one pipe of the passage is connected to a pressurizing device.

* * * * *